(12) United States Patent
Ueda et al.

(10) Patent No.: US 6,800,105 B2
(45) Date of Patent: Oct. 5, 2004

(54) ABRASIVE FOR METAL

(75) Inventors: Kazumasa Ueda, Tsukuba (JP); Masayuki Takashima, Sodegaura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 53 days.

(21) Appl. No.: 09/756,140

(22) Filed: Jan. 9, 2001

(65) Prior Publication Data

US 2001/0020348 A1 Sep. 13, 2001

(30) Foreign Application Priority Data

Jan. 11, 2000 (JP) ........................................ 2000-002435
Apr. 28, 2000 (JP) ........................................ 2000-130346

(51) Int. Cl.[7] .............................. C09G 1/02; C09G 1/04
(52) U.S. Cl. ............................ 51/298; 106/3; 252/79.1
(58) Field of Search ........................... 51/307, 308, 309, 51/298; 106/3; 438/692, 693; 216/89; 252/79.1

(56) References Cited

U.S. PATENT DOCUMENTS

| | | | |
|---|---|---|---|
| 4,618,569 A | * 10/1986 | Kurematsu et al. | 430/428 |
| 5,476,606 A | * 12/1995 | Brancaleoni et al. | 216/89 |
| 5,607,718 A | 3/1997 | Sasaki et al. | |
| 5,614,444 A | * 3/1997 | Farkas et al. | 216/89 |
| 5,709,588 A | * 1/1998 | Muroyama | 451/28 |
| 5,775,980 A | 7/1998 | Sasaki et al. | |
| 5,821,167 A | 10/1998 | Fukami et al. | |
| 5,861,055 A | * 1/1999 | Allman et al. | 106/11 |
| 5,866,226 A | 2/1999 | Masumura et al. | |
| 5,891,353 A | 4/1999 | Masumura et al. | |
| 6,022,400 A | * 2/2000 | Izumi et al. | 106/3 |
| 6,042,741 A | * 3/2000 | Hosali et al. | 252/79.1 |
| 6,063,306 A | * 5/2000 | Kaufman et al. | 216/89 |
| 6,372,003 B1 | * 4/2002 | Kasai et al. | 106/3 |
| 6,375,545 B1 | 4/2002 | Yano et al. | |
| 2002/0077035 A1 | 6/2002 | Wang et al. | |
| 2002/0193451 A1 | 12/2002 | Motonari et al. | |

FOREIGN PATENT DOCUMENTS

| | | |
|---|---|---|
| EP | 0 919 602 A1 | 6/1999 |
| EP | 919602 | * 6/1999 |
| EP | 1 020 488 A2 | 7/2000 |
| EP | 1020501 A2 | * 7/2000 |
| JP | 51-142791 | 12/1976 |
| JP | 57-008278 A | 1/1982 |
| JP | 1-297487 A | 11/1989 |
| JP | 7-86216 A | 3/1995 |
| JP | 7-223160 A | 8/1995 |
| JP | 9-7987 A | 1/1997 |
| JP | 9-225810 A | 9/1997 |
| JP | 9-285957 A | 11/1997 |
| JP | 10-102041 A | 4/1998 |
| JP | 10-102042 A | 4/1998 |
| JP | 10-231473 A | 9/1998 |
| JP | 10-270400 A | 10/1998 |
| JP | 10-275788 A | 10/1998 |
| JP | 10-275789 A | 10/1998 |
| JP | 11-54463 A | 2/1999 |
| JP | 11-114808 A | 4/1999 |
| JP | 11-121412 A | 4/1999 |
| JP | 11-156702 A | 6/1999 |
| JP | 11-162910 A | 6/1999 |
| JP | 11-176774 A | 7/1999 |
| JP | 11188647 | * 7/1999 |
| JP | 11-246852 A | 9/1999 |
| JP | 2000-1667 A | 1/2000 |
| JP | 2000-204275 A | 7/2000 |
| JP | 2000-204352 A | 7/2000 |
| JP | 2000-204353 A | 7/2000 |
| JP | 2000-204355 A | 7/2000 |
| JP | 2000-208452 A | 7/2000 |
| JP | 2000-212776 A | 8/2000 |
| JP | 2001-55559 A | 2/2001 |
| JP | 2001-57351 A | 2/2001 |
| WO | 99/64527 | * 12/1999 |

\* cited by examiner

Primary Examiner—Michael Marcheschi
(74) Attorney, Agent, or Firm—Birch, Stewart, Kolasch & Birch, LLP

(57) ABSTRACT

An abrasive for metal having particle that have a functional group capable of trapping a metal ion, a process for producing the abrasive, and a polishing composition having the abrasive, an oxidizing agent and water, are provided.

9 Claims, No Drawings

ABRASIVE FOR METAL

BACKGROUND OF THE INVENTION

1. Field of the Invention

The present invention relates to an abrasive for metal, a polishing composition for metal and a process for polishing a metal using the same. More precisely, the present invention relates to an abrasive and a polishing composition for polishing a metal film, particularly a copper-based metal film, to be used in the production of semiconductor devices, and a process for polishing a metal using said polishing composition for metal.

2. Description of Related Art

In recent years, various fine processing techniques have been researched and developed for advanced high integration and high performance of LSI wherein LSI stands for "Large Scale Integration". Among them, the chemical mechanical polishing (hereafter, may be abbreviated as CMP) has been attracting the attention. CMP is a composite technique involving a chemical action and a mechanical action between a polishing composition and a material to be polished. It is an essential technique in the planarizing of insulating interlayers, particularly in the multilayer wiring formation step, in the metal plug formation, in the buried-type metal wiring formation and the like.

From the viewpoint of speeding-up of LSI, it is considered that the main current of metals used in the metal wiring in future would be a metal with a low resistance, and formation of the buried type wiring using a metal with a low resistance has been actively attempted. For example, various attempts have been made on copper-based metals as examples of metals with a low resistance.

For the polishing of copper-based metals, compositions containing, as the main ingredients, an abrasive of a particulate inorganic oxide such as alumina or silica and an oxidizing agent such as ferric nitrate or hydrogen peroxide have generally been used. There has been a problem, however, that copper-based metals could not be polished with a high speed using such a polishing composition containing an abrasive of inorganic oxide and an oxidizing agent.

In order to improve the polishing rate, therefore, a technology for high speed polishing with simultaneous etching have been developed by adding an additive with etching nature such as a complexing agent (for example, an amine, glycine or the like) capable of forming a water-soluble copper complex by reacting with copper ion. In this technology, however, there has been a tendency of generating the dishing, i.e. thinning in the central portion, in wide-spread regions of metal wiring film, particularly those buried in a groove or opening, by isotropic etching of metal when a metal wiring formed on a semiconductor substrate is polished with a polishing composition containing an additive with etching nature. When dishing occurs, problems arise that, in addition to deterioration of the planarity, high resistance as compared with a layer of buried metal wiring, and some others, will result.

On the other hand, attempts have also been made to accomplish polishing, without etching, by polishing a copper complex, which is difficultly soluble in water and more mechanically fragile than copper, formed on the surface of copper by reaction of copper.

However, while the polishing composition forming a fragile copper complex allowed a faster polishing as compared with the above-described conventional polishing composition containing an inorganic oxide particle and an oxidizing agent, it had a problem that its polishing rate was slower than that with the above-cited polishing composition with etching nature.

In addition, since copper-based metals has a low hardness, problems occurred that the surface of the copper-based metal became rough by scratches and that abrasives were embedded in the metal when particles of inorganic oxide having a high hardness were used as the abrasives.

Therefore, a method in which particle containing a soft organic polymer compound as the main component has been proposed. This method had also a problem that a high polishing rate could not be obtained unless it contained an additive with etching nature.

The object of the invention is to provide an abrasive for metal which allows a high speed polishing of metals, which inhibits generation of scratches on the polishing surface and which inhibits etching of the metal; an abrasive for metal which allows formation of excellent processing surface. Another object of the invention is to provide a polishing composition for metal which enables further improvement in planarity of polishing surface.

As the result of extensive studies conducted for solving the above-described problems, the present inventors have found the fact that the above objects can be attained by using particle having a functional group capable of trapping a metal ion and thus completed the invention.

SUMMARY OF THE INVENTION

The invention relates to [1] an abrasive for metal comprising particle having a functional group capable of trapping a metal ion.

The present invention also relates to [2] a polishing composition for metal comprising an abrasive for metal according to the above described [1], an oxidizing agent and water.

Further, the present invention relates to [3] the polishing composition for metal according to the above described [2] further comprising at least one selected from the group consisting of a spherical particle, benzotriazole and a benzotriazole derivative.

Still further, the present invention relates to [4] a process for polishing a metal by chemical mechanical polishing, said process using a polishing composition for metal according to the above described [2] or [3].

DETAILED DESCRIPTION OF THE INVENTION

The invention will be described below in detail.

The abrasive for metal of the invention is characterized in that it comprises particle having a functional group capable of trapping a metal ion.

In addition, the abrasive for metal of the invention is characterized in that it comprises particle containing a compound having a functional group capable of trapping a metal ion.

The functional group capable of trapping a metal ion may be anyone that contains a coordinating atom and specifically includes functional groups containing at least one selected from the group consisting of Oxygen atom, Nitrogen atom, Sulfur atom, Phosphorous atom, Arsenic atom and Selenium atom.

Specific examples of said functional group include:

—OH (compounds include alcohols, phenols or enols), —COOM (wherein M represents hydrogen, an alkali metal, an alkaline earth metal or an ammonium group, and compounds include carboxylic acids or carboxylate salts), >C=O (compounds include aldehydes, ketones or quinones), —O— (compounds include ethers), —COOR (wherein R represents a hydrocarbon group, and compounds include esters), —CONH$_2$ (compounds include amides), —NO (compounds include nitroso compounds), —NO$_2$ (compounds include nitro compounds),

→N→O (compounds include N-oxides), —SO$_3$M (wherein M has the same meaning as defined above, and compounds include sulfonic acid or sulfonate salts), —PHO(OM) (wherein M has the same meaning as defined above, and compounds include hypophosphorous acid or hypophosphite salts), —PO(OM)$_2$ (wherein M has the same meaning as defined above, and compounds include phosphorous acid or phosphite salts), —AsO(OM)$_2$ (wherein M has the same meaning as defined above, and compounds include arsonic acid or arsonate salts), as those coordinated through an O-atom;

—NH$_2$ (compounds include primary amines), >NH (compounds include secondary amines),

→N (compounds include tertiary amines), —N=N— (compounds include azo compounds or heterocyclic compounds), >C=N— (compounds include Schiff bases or heterocyclic compounds), —CONH$_2$ (compounds include amides), >C=N—OH (compounds include oximes), >C=NH (compounds include imines or enamines), —SCN (compounds include thiocyanates), as those coordinated through a N-atom;

—SH (compounds include thioalcohols or thiophenols), —S— (compounds include thioethers), >C=S (compounds include thioaldehydes or thioketones), —COSM (wherein M has the same meaning as defined above, and compounds include thiocarboxylic acid or thiocarboxylate salts), —CSSM (wherein M has the same meaning as defined above, and compounds include dithiocarboxylic acid or dithiocarboxylate salts), —CSNH$_2$ (compounds include thioamides), —NCS (compounds include isothiocyanates), as those coordinated through a S-atom;

>P— (compounds include primary, secondary or tertiary alkyl or aryl phosphine), as those coordinated through a P-atom;

>As— (compounds include primary, secondary or tertiary alkyl or aryl arsene), as those coordinated through an As-atom;

—SeH (compounds include selenols), >C=Se (compounds include selenocarbonyl compounds) and —CSeSeM (wherein M has the same meaning as defined above, and compounds include diselenocarboxylic acid or diselenocarboxylate salts).

Among these functional groups capable of trapping a metal ion preferred are —OH, —COOM, >C=O, —O—, —SO$_3$M, —PO(OM)$_2$, —NH$_2$, >NH,

→N,

—SH, —S—, —COSM and —CSSM.

These functional groups can be used independently or in combination of two or more. When two or more functional groups are used in combination, particles having different functional groups or particles containing compounds having different functional groups may be used, and particle having two or more functional groups or particle containing a compound having two or more functional groups may be used. Examples of the particle having two or more functional groups or the particle containing a compound having two or more functional groups include those having aminocarboxylic acids, aminoalcohols, aminophosphonic acids and the like as the functional group.

The functional group capable of trapping a metal ion preferably exists on the surface of the particle. Even if the group does not exist on the surface of the particle, the same effect can be obtained when the functional group capable of trapping a metal ion can appear on the surface of the particle and can contact with a metal to be polished by crushing of the particle due to stress on polishing, by peeling of a coating film or by other situations.

As the particle having a functional group capable of trapping a metal ion can be used particles of a metal oxide such as alumina, titania, zirconia, silica, ceria and the like to which said functional group is introduced. Introduction of the functional group can be performed by applying a conventional method. For example, in the case of particle of a metal oxide, usable particle can be obtained by reacting a silane coupling agent or a titanate coupling agent having the desired functional group, as the particle containing a compound having a functional group capable of trapping a metal ion, with particles of a metal oxide.

In addition, polymer particles having the functional group introduced therein can be used as the particle having a functional group capable of trapping a metal ion. Introduction of the functional group can be performed by applying a conventional method. For example, in the case of a polymer particle, usable particle can be obtained by a method in which a monomer having the desired functional group is polymerized, by a method in which any other functional group in a polymerized polymer molecule is chemically converted to the desired functional group or by other methods. Polymer particles are preferred because generation of scratches during polishing can be inhibited due to their soft nature as compared with particles of metal oxide.

Specific examples of the polymer particle having a functional group capable of trapping a metal ion include particles of ion exchange resin. Said ion exchange resin includes cation exchange resins, anion exchange resins and chelate resins. Examples of the cation exchange resins include cation exchange resins having —SO$_3$M (wherein M has the same meaning as defined above, and compounds include sulfonic acid or sulfonate salts), —COOM (wherein M has the same meaning as defined above, and compounds include carboxylic acids or carboxylate salts) or the like as the functional group. Examples of the anion exchange resins include anion exchange resins having an amino group, a mono-substituted amino group, a di-substituted amino group or the like as the functional group. Examples of the chelate resins include chelate resins having an aminocarboxylic acid, an aminosulfonic acid, an iminodiacetic acid or the like as the functional group.

The chelate resins are resins having, on their surface, a multi-dentate ligand which has plural coordinating atoms forming a complex with a metal. In general, when a multi-dentate ligand having two or more coordinating atoms is bound to a metal ion, a chelate ring is formed resulting in a greater stability than a complex having a mono-dentate ligand. Such case is preferred because the capacity of trapping an ion of a metal to be polished becomes greater.

In addition, an abrasive for metal comprising an ion exchange resin having an average particle diameter of 1.0 μm or less is preferred as the abrasive for metal. When the abrasive for metal has an average particle diameter of 1.0 μm or less, the processing accuracy of the polishing surface can be further improved.

The average particle diameter herein refers to an average particle diameter measured by the dynamic light scattering (average diameter of secondary particle diameter).

The process for producing the abrasive for metal include a method in which an ion exchange resin is subjected to wet-milling to realize an average particle diameter of 1.0 μm or less.

Examples of methods for the wet-milling include those using a conventional milling apparatus such as an oscillating mill, ball mill and the like. In order to avoid metal contamination from the mill or others, it is preferred to use zirconia or a polymer as a liquid-contacting part. If necessary, particles may be used after adjusting the particle size to the desired value by separating coarse particles through a step such as wet type gravity sedimentation, centrifugation, filtering or the like.

Furthermore, primary crushing by dry-milling before the wet-milling is preferred for improving milling efficacy in the wet-milling. Examples of methods for the dry-milling include those using a conventional milling apparatus such as jaw crusher, gyratory crusher, roll crusher, edge runner, hammer crusher, ball mill, jet mill, disc crusher or the like. In order to avoid metal contamination from the mill or others, it is preferred to use zirconia or a polymer as a liquid-contacting part. If necessary, particles may be used after adjusting the particle size to the desired value by separating coarse particles through a step such as dry type air classification or the like.

In addition, particle having a functional group capable of trapping a metal ion may impregnating or coating particle of metal oxide or a polymer particle with a compound having said functional group obtain particle.

Next, the polishing composition for metal of the invention is characterized in that it comprises the particle having a functional group capable of trapping a metal ion or the particle containing a compound having a functional group capable of trapping a metal ion, an oxidizing agent and water.

The oxidizing agent used in the polishing composition for metal of the invention has preferably an effect of improving the polishing rate. Conventional oxidizing agents can be used as said oxidizing agent. Examples include hydrogen peroxide, iodic acid, iodate salt and the like, with hydrogen peroxide being preferred.

The usual concentration of the oxidizing agent in the polishing composition for metal of the invention is preferably within a range of about 0.1 to 15% by weight based on said polishing composition for metal. When the concentration of said oxidizing agent is lower than 0.1% by weight, it is difficult to exhibit the effect of improving the polishing rate. On the other hand, when the concentration exceeds 15% by weight, it is sometimes uneconomical because the polishing rate may not be improved in proportion to the concentration.

The time of adding said oxidizing agent is not particularly limited insofar as the oxidizing agent is not deteriorated. Addition immediately before the polishing is preferred because sometimes its effect is lowered by the change of quality with time.

When said abrasive is used for polishing a metal, it is used in the form of a slurry-form polishing composition in which said abrasive, oxidizing agent are dispersed in water. The formation of the polishing composition can be accomplished by simultaneously mixing and dispersing an abrasive, an oxidizing agent and water; or by previously mixing an abrasive and water, an abrasive and an oxidizing agent, or an oxidizing agent and water, and then mixing and dispersing with other ingredients missing therein for use in polishing in the form of a polishing composition. The dispersing method for forming a slurry can be a known method, including methods using a homogenizer, ultrasonic wave, wet medium mill and the like. The concentration of the slurry (the content of the abrasive in the polishing composition) may usually be about 1 to 30% by weight. When the concentration of abrasive is less than 1% by weight, it is difficult to exhibit the effect of improving the polishing rate. On the other hand, when the concentration exceeds 30% by weight, it is sometimes uneconomical because the polishing rate may not be improved in proportion to the concentration.

The polishing composition for metal of the invention may further contain at least one selected from the group consisting of a spherical particle, benzotriazole and a benzotriazole derivative, with the purpose of improving the planarity performance when a metal having unevenness on its surface is polished. The spherical particle may be roughly sphere-like form and may be inorganic oxide particle such as colloidal silica, colloidal alumina and the like, polymer particle such as emulsion synthesized by emulsion polymerization or others.

The usual concentration of the spherical particle in the polishing composition for metal is preferably within a range of about 0.1 to 30% by weight based on said polishing composition for metal. The usual concentration of benzotriazole or the benzotriazole derivative in the polishing composition for metal is preferably within a range of about 0.01 to 0.2% by weight based on said polishing composition for metal.

Further, the polishing composition for metal of the invention preferably contains an abrasive for metal comprising an ion exchange resin having an average particle diameter of 1.0 μm or less, an oxidizing agent and water. By using said polishing composition for metal, an excellent processing surface having less scratch can be obtained. The ion exchange resin contains chelate resins.

The polishing composition for metal of the invention may contain, if necessary, an additive such as surfactant for the purpose of improving the stability of dispersion, inhibition of sedimentation, roughness of polishing surface and the like. The surfactant may be anionic, cationic, nonionic or amphoteric, and two or more of them can be used in combination.

While the pH of the polishing composition for metal of the invention is not critical because the pH effective for polishing depends on the kind of the functional group or the kind of metal to be treated, usual value is about 1 to 8 and preferably 2 to 6. When the pH of the polishing composition is lower than 1, a problem about the handling of the polishing composition or corrosion of polishing apparatus may arise. The pH of the polishing composition for metal of the invention can be adjusted with a known acid or alkali. It is preferred to use an acid or alkali free of metal ion such as nitric acid, phosphoric acid, sulfuric acid, ammonium hydroxide, amines or the like.

The polishing composition for metal of the invention can be used for polishing various metals, suitably copper-based metal. Said polishing composition is preferably used for polishing metal films, particularly copper-based metal films formed on semiconductor substrates. The copper-based metal includes pure copper film, copper alloy films and the like.

By using the polishing composition for metal of the invention, metals can be polished at a high speed, and generation of scratches on the polishing surface as well as etching of the metal can be inhibited.

The process for polishing according to the invention is a process for polishing a metal by chemical mechanical polishing and characterized by use of the above-described polishing composition for metal of the invention as the polishing composition. The process for polishing according to the invention can be suitably applied to metal films, particularly metal films formed on semiconductor substrates, amongst copper films.

EXAMPLES

The invention will now be described with reference to Examples, which should not be construed as a limitation upon the scope of the invention.

In the following description, the average diameter of particle is determined by measuring the accumulated 50% diameter with a Microtrac UPA particle size analyzer (manufactured by Nikkiso Co., Ltd.).

Example 1
(Preparation of a Polishing Composition)

A chelate resin having an aminocarboxyl group as a functional group capable of trapping a metal ion (trade name: Sumichelate MC-75, manufactured by Sumitomo Chemical Co., Ltd.) was subjected to wet-dispersing using a ball mill. Hydrogen peroxide as an oxidizing agent was added to the obtained slurry. The mixture was adjusted to an abrasive concentration of 2.5% by weight and a hydrogen peroxide concentration of 1.5% by weight and then pH was adjusted to 5 or 3 with nitric acid to give a polishing composition.
(Polishing of a Copper Film)

Using the above polishing composition, a wafer having a copper film formed by spattering was polished with a polishing machine (MECAPOL E-460, manufactured by Presi). The polishing conditions included a revolution number of rotary platen of 60 rpm, a revolution number of a holding jig for wafer of 60 rpm, a polishing pressure of 200 g/cm$^2$, a flow rate of polishing composition of 100 ml/minute and polishing period of 30 seconds. The results of polishing are shown in Table 1.

Example 2

A chelate resin having an iminodiacetic acid group as a functional group capable of trapping a metal ion (trade name: Sumichelate MC-700, manufactured by Sumitomo Chemical Co., Ltd.) was subjected to wet-dispersing using a ball mill. Hydrogen peroxide as an oxidizing agent was added to the obtained slurry. The mixture was adjusted to an abrasive concentration of 2.5% by weight and a hydrogen peroxide concentration of 1.5% by weight and then pH was adjusted to 5, 4 or 3 with nitric acid to give a polishing composition. Copper films were polished in the same manner as in Example 1. The results are shown in Table 1.

Example 3

An ion exchange resin having a carboxyl group as a functional group capable of trapping a metal ion (trade name: Duolite C 476, manufactured by Rhom & Haas Co.) was subjected to wet-dispersing using a ball mill. Hydrogen peroxide as an oxidizing agent was added to the obtained slurry. The mixture was adjusted to an abrasive concentration of 2.5% by weight and a hydrogen peroxide concentration of 1.5% by weight and then pH was adjusted to 3 with nitric acid to give a polishing composition. A copper film was polished in the same manner as in Example 1. The result is shown in Table 1.

Comparative Example 1

Colloidal silica (trade name: Snowtex, manufactured by Nissan Chemical Ind.), particle of inorganic oxide, was used as the abrasive for polishing. The abrasive concentration was adjusted to 2.5% by weight and the hydrogen peroxide concentration was adjusted to 1.5% by weight and then pH was adjusted to 5 or 3 with nitric acid to give a polishing composition. Copper films were polished in the same manner as in Example 1. The results are shown in Table 1.

Comparative Example 2

PMMA aqueous emulsion resin was used as the abrasive for polishing. The abrasive concentration was adjusted to 2.5% by weight and the hydrogen peroxide concentration was adjusted to 1.5% by weight and then pH was adjusted to 3 with potassium hydroxide to give a polishing composition. A copper film was polished in the same manner as in Example 1. The result is shown in Table 1.

TABLE 1

|  | pH | Polishing rate (angstrom/minute) |
| --- | --- | --- |
| Example 1 | 5 | 828 |
|  | 3 | 1620 |
| Example 2 | 5 | 661 |
|  | 4 | 1833 |
|  | 3 | 4956 |
| Example 3 | 3 | 2818 |
| Comparative example 1 | 5 | 376 |
|  | 3 | 547 |
| Comparative example 2 | 3 | 362 |

In the cases of Examples 1 to 3 using the polishing compositions comprising particle having a functional group capable of trapping a metal ion, a high polishing rate is obtained. In the cases of Comparative Example 1 using the polishing composition comprising colloidal silica and Comparative Example 2 using the polishing composition comprising PMMA aqueous emulsion resin, the polishing rate was slow.

Example 4

A copper film wafer having a film thickness of 10,000 angstroms, L/S of 5/0.8 μm and a pattern with an initial difference in level of 5,000 angstroms was polished using the polishing composition having an adjusted pH of 4 obtained in Example 2. After polishing for 3 minutes and 20 seconds, the pattern was measured by a level-difference meter. The residual difference in level was 1,000 angstroms.

Example 5

A chelate resin having an iminodiacetic acid group as a functional group capable of trapping a metal ion (trade name: Sumichelate MC-700, manufactured by Sumitomo Chemical Co., Ltd.) was subjected to wet-dispersing using a ball mill. Hydrogen peroxide as an oxidizing agent was added to the obtained slurry. Colloidal silica (trade name: Snowtex, manufactured by Nissan Chemical Ind.) as a spherical particle was added. The mixture was adjusted to an abrasive concentration of 2.5% by weight, a hydrogen peroxide concentration of 1.5% by weight and a colloidal silica concentration of 1.0% by weight and then pH was adjusted to 4 with nitric acid to give a polishing composition. A copper film and a patterned copper film were polished in the same manner as in Example 1 and 4, respectively. The polishing rate of copper film was 1,660 angstroms/minute and the residual difference in level in the pattern after polishing the patterned copper film wafer for 3 minutes and 20 seconds was approximately 0 angstrom.

Example 6

The polishing in Example 5 was substantially repeated except that particle of polystyrene emulsion was used as the spherical particle. The polishing rate of copper film was 2,054 angstroms/minute and the residual difference in level in the pattern after polishing the patterned copper film wafer for 3 minutes was 400 angstroms.

Example 7

The polishing in Example 5 was substantially repeated except that a particulate PMMA aqueous emulsion was used as the spherical particle. The polishing rate of copper film was 1,277 angstroms/minute and the residual difference in level in the pattern after polishing the patterned copper film wafer for 4 minutes and 30 seconds was 600 angstroms.

Example 8

The polishing in Example 5 was substantially repeated except that 0.1% by weight benzotriazole was used in place of colloidal silica. The polishing rate of copper film was 572 angstroms/minute and the residual difference in level in the pattern after polishing the patterned copper film wafer for 10 minutes was approximately 0 angstrom.

Example 9

(Preparation of an Abrasive)

To 60 g of a chelate resin having an iminodiacetic acid group as a functional group capable of trapping a metal ion (trade name: Sumichelate MC-700, manufactured by Sumitomo Chemical Co., Ltd.) was added 70 g of purified water. The mixture was subjected to ball mill treatment using an alumina ball of 10 mm φ and under conditions including a revolution number of 200 rpm and treating period of 30 hours. The obtained abrasive had an average particle diameter of 0.4 μm.

(Preparation of a Polishing Composition)

The obtained abrasive was diluted with purified water. As an oxidizing agent, hydrogen peroxide was added. The mixture was adjusted to an abrasive concentration of 2.5% by weight and a hydrogen peroxide concentration of 1.5% by weight and then pH was adjusted to 3 with nitric acid to give a polishing composition.

(Polishing of a Copper Film)

Using the above polishing composition, a wafer having a copper film formed by spattering was polished with a polishing machine (MECAPOL E-460, manufactured by Presi). The polishing conditions included a revolution number of rotary platen of 60 rpm, a revolution umber of a holding jig for wafer of 60 rpm, a polishing pressure of 200 g/cm$^2$, a flow rate of polishing composition of 100 ml/minute and polishing period of 30 seconds. The results of polishing are shown in Table 2.

Example 10

Using a hammer mill (revolution number: 14,000 rpm, diameter of screen φ: 1.0 mm), 3 kg of a chelate resin having an iminodiacetic acid group as a functional group capable of trapping a metal ion (trade name: Sumichelate MC-700, manufactured by Sumitomo Chemical Co., Ltd.) was subjected to dry-milling. The average particle diameter was 126 μm. The obtained ground product was subjected again to dry-milling using a hammer mill (revolution number: 14,000 rpm, diameter of screen φ: 0.3 mm). The average particle diameter was 91 μm. To 300 g of the obtained ground product was added 310 g of purified water. The mixture was subjected to ball mill treatment using a zirconia ball of 5 mm φ and under conditions including a revolution number of 70 rpm and treating period of 30 hours. The obtained abrasive had an average particle diameter of 0.3 μm.

The obtained abrasive was diluted with purified water. As an oxidizing agent, hydrogen peroxide was added. The mixture was adjusted to an abrasive concentration of 2.5% by weight and a hydrogen peroxide concentration of 1.5% by weight and then pH was adjusted to 3 with nitric acid to give a polishing composition. A copper film was polished in the same manner as in Example 9. The results are shown in Table 2.

Comparative Example 3

Colloidal silica (trade name: Snowtex, average particle diameter: 0.1 μm, manufactured by Nissan Chemical Ind.), particle of inorganic oxide, was used as the abrasive for polishing. The abrasive concentration was adjusted to 2.5% by weight and the hydrogen peroxide concentration was adjusted to 1.5% by weight and then pH was adjusted to 3 with nitric acid to give a polishing composition. A copper film was polished in the same manner as in Example 9. The results are shown in Table 2.

Comparative Example 4

PMMA aqueous emulsion resin (average particle diameter: 0.2 μm) was used as the abrasive for polishing. The abrasive concentration was adjusted to 2.5% by weight and the hydrogen peroxide concentration was adjusted to 1.5% by weight and then pH was adjusted to 3 with potassium hydroxide to give a polishing composition. A copper film was polished in the same manner as in Example 9. The results are shown in Table 2.

Example 11

The hammer mill-ground product of chelate resin having an average particle diameter of 91 μm obtained in Example 10 was diluted with purified water. As an oxidizing agent, hydrogen peroxide was added. The mixture was adjusted to an abrasive concentration of 2.5% by weight and a hydrogen peroxide concentration of 1.5% by weight and then pH was adjusted to 3 with nitric acid to give a polishing composition. A copper film was polished in the same manner as in Example 10. The results are shown in Table 2.

Example 12

To 60 g of the hammer mill-ground product of chelate resin having an average particle diameter of 91 μm obtained in Example 10 was added 70 g of purified water. The mixture was subjected to ball mill treatment using a zirconia ball of 5 mm φ and under conditions including a revolution number of 200 rpm and treating period of 8 hours. The obtained abrasive had an average particle diameter of 4.0 μm.

The obtained abrasive was diluted with purified water. As an oxidizing agent, hydrogen peroxide was added. The mixture was adjusted to an abrasive concentration of 2.5% by weight and a hydrogen peroxide concentration of 1.5% by weight and then pH was adjusted to 3 with nitric acid to give a polishing composition. A copper film was polished in the same manner as in Example 10. The results are shown in Table 2.

Example 13

To 60 g of the hammer mill-ground product of chelate resin having an average particle diameter of 91 μm obtained in Example 10 was added 70 g of purified water. The mixture was subjected to ball mill treatment using a zirconia ball of 5 mm φ and under conditions including a revolution number of 200 rpm and treating period of 9 hours. The obtained abrasive had an average particle diameter of 1.2 μm.

The obtained abrasive was diluted with purified water. As an oxidizing agent, hydrogen peroxide was added. The mixture was adjusted to an abrasive concentration of 2.5% by weight and a hydrogen peroxide concentration of 1.5% by weight and then pH was adjusted to 3 with nitric acid to give a polishing composition. A copper film was polished in the same manner as in Example 10. The results are shown in Table 2.

TABLE 2

|  | Average particle diameter (μm) | Polishing rate (angstrom/minute) | Condition of surface |
|---|---|---|---|
| Example 9 | 0.4 | 4066 | Scratch was absent |
| Example 10 | 0.3 | 4567 | Scratch was absent |
| Comparative example 3 | 0.1 | 547 | Scratch was absent |
| Comparative example 4 | 0.2 | 362 | Scratch was absent |
| Example 11 | 91 | 825 | Scratch was present |
| Example 12 | 4.0 | 3073 | Scratch was present |
| Example 13 | 1.2 | 3519 | Scratch was present |

In the cases of Examples 9 and 10 using the polishing compositions comprising ion exchange resin, a high polishing rate is obtained. In the cases of Comparative Example 3 using the polishing composition comprising colloidal silica and Comparative Example 4 using the polishing composition comprising PMMA aqueous emulsion resin, the polishing rate was slow.

Examples 9 and 10, in which polishing compositions comprising an ion exchange resin having an average particle diameter of 1.0 μm or less were used, gave a superior processing surface than those of Examples 11 to 13, in which polishing compositions comprising an ion exchange resin having an average particle diameter exceeding 1.0 μm were used.

Since use of the abrasive for metal, the composition for metal polishing and the process for polishing metal using them enables a high speed polishing of metals, particularly metal films, inhibition of generation of scratches on the polishing surface and inhibition of etching of the metal, and particularly enables production of an excellent processing surface and further enables improvement in smoothness of polishing surface, the invention has a great industrial value.

What is claimed is:

1. A polishing composition for metal comprising an oxidizing agent, water and a polymer particle having a functional group that traps a metal ion, wherein the functional group that traps a metal ion is iminodiacetic acid.

2. The polishing composition according to claim 1, wherein the average diameter of the particle is 1.0 μm or less.

3. A process for producing an abrasive for metal comprising a polymer particle having a functional group that traps a metal ion, wherein the functional group traps a metal ion is iminodiacetic acid, wherein the process comprises wet-milling the polymer having a functional group that traps a metal ion.

4. A process for producing an abrasive for metal comprising a polymer particle having a functional group that traps a metal ion, wherein the functional group that traps a metal ion is iminodiacetic acid, wherein the process comprises dry-milling and then wet-milling the polymer having a functional group that traps a metal ion.

5. The polishing composition for metal according to claim 1,wherein the metal is copper or copper alloy.

6. The polishing composition for metal according to claim 1, wherein the oxidizing agent is hydrogen peroxide.

7. The polishing composition for metal according to claim 1, wherein the composition further comprises at least one selected from the group consisting of a spherical particle, benzotriazole and a benzotriazole derivative.

8. A process for polishing a metal by chemical mechanical polishing, wherein the process is conducted by using the polishing composition for metal according to claim 1.

9. The process according to claim 8, wherein the metal is copper alloy.

* * * * *